(12) United States Patent
Wang et al.

(10) Patent No.: US 7,539,554 B2
(45) Date of Patent: May 26, 2009

(54) TAPE OUT TEMPLATE SYSTEM AND METHOD

(75) Inventors: Shin-Meei Wang, Taichung (TW); Piao-Chuo Tsao, Bade (TW); Yu Chen, Hsinchu (TW); Szu-Ping Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 471 days.

(21) Appl. No.: 11/397,916

(22) Filed: Apr. 4, 2006

(65) Prior Publication Data

US 2006/0224264 A1 Oct. 5, 2006

Related U.S. Application Data

(60) Provisional application No. 60/668,139, filed on Apr. 4, 2005.

(51) Int. Cl.
*G06F 19/00* (2006.01)
*G06F 17/50* (2006.01)
*G06F 7/00* (2006.01)

(52) U.S. Cl. ......................................... 700/121; 716/19
(58) Field of Classification Search ................. 700/121; 716/19
See application file for complete search history.

(56) References Cited

U.S. PATENT DOCUMENTS

| 7,325,206 | B2 * | 1/2008 | White et al. | 716/4 |
| 2006/0026549 | A1 * | 2/2006 | Tsao et al. | 716/19 |

* cited by examiner

*Primary Examiner*—Albert DeCady
*Assistant Examiner*—Thomas H Stevens
(74) *Attorney, Agent, or Firm*—Thomas, Kayden, Horstemeyer & Risley

(57) ABSTRACT

A tape out template system is provided. The tape out template system comprises a template database, a query database, and a processor. The template database stores a plurality of templates for mask tooling for different manufacturing technologies. Each of the templates comprises a set of mask tooling settings for different manufacturing processes of one of the manufacturing technologies. The query database stores a hierarchy of queries addressing differences among mask tooling information of the manufacturing processes. The processor receives technology information specifying the manufacturing technology of the tape out request, selects one of the templates according to the received technology information, selects and presents at least one of the queries according to the selected template, and determines values of the mask tooling settings according to the answers to the presented queries.

20 Claims, 7 Drawing Sheets

Maintain Optional Question

| Insert | Delete | Update | Up | Down |
|---|---|---|---|---|

| Seq. | Question Item | Question Description | Option Number | OP-1 | OP-2 | OP-3 | OP-4 |
|---|---|---|---|---|---|---|---|
| 1 | FAB | Please enter FAB | 3 | FAB3 | FAB8A | FAB9 | |

FIG. 3A

CAD Layer Definition

By Customer: Default ▼ | Create | Remove
Insert | Delete | Update | Up | Down

| | Layer Name | Optional Layer | CAD Layer # |
|---|---|---|---|
| | | | Default |
| ⦿ | 5VESD | Optional | 36 |
| ○ | CO | Must | 15 |
| ○ | ESD | Optional | 30 |

FIG. 3B

Maintain STI Template Question

| Insert | Delete | Update | Up | Down |

| Seq. | Type | Question Item | Question Description | Optional Answer | Mask Code |
|---|---|---|---|---|---|
| 1 | SngSel | Core/IO voltage | If 3.3/5V, then mask 114,116 are needed. | 3.3/5V<br>3.3V | 114,116,132,002 |
| 2 | Y/N | NDIFF/PDIFF | Some of IP Vendors use PDIFF CAD layer 7 and NDIFF CAD layer 8 for OD Mask 120 Patterning, please confirm. | | NDIFF, PDIFF |

FIG. 3C

Maintain MT Template

| Insert | Delete | Update | Up | Down |

Max top Thick: Top [1]   Thick [ ]   Metal   Min: [2]   Max: [5]

| Seq. | Mask Code | Layer Catg. | Mask Stage | CKT Layer | Dummy Layer | DGTA Tone | Mask Type | OPC Type | PSM Type | Mask Grade | S/L Tone | CAD Bias/Logical Operation |
|---|---|---|---|---|---|---|---|---|---|---|---|---|
| 1 | 120 | MUST | OD1-ETCH | OD | | D | Optional | B | B | F | D | 0 |
| 2 | 121 | MUST | ODR-ETCH | LOGICAL OPR | | C | BIN | B | B | D | C | (((OD SIZING -0.4) SIZING 0.4) SIZING -0.2) |

| Edit MT Template Layer | | | | | |
|---|---|---|---|---|---|
| Ok | Cancel | | | | |
| Mask Code | 120 | | | | |
| Mask Stage | OD1-ETCH ▶ | | | | |
| Layer Catg. | Must ▶ | seq: | ○ Thin ○ Thick | | |
| CKT Layer | ⦿ Standard<br>○ Optional | OD | Edit | | |
| DGTA Tone | ⦿ Standard<br>○ Optional | D ▶ | | | |
| Mask Type | ○ Standard<br>⦿ Optional | FAB ▶<br>FAB3<br>FAB8A<br>FAB9 | DUV/DUV ▶<br>SCN/SCANER ▶<br>BIN/BIN ▶ | | |

TAPE OUT TEMPLATE SYSTEM AND METHOD

CROSS REFERENCE TO RELATED APPILCATIONS

This application claims the benefit of U.S. Provisional Application No. 60/668,139, filed Apr. 4, 2005.

BACKGROUND

The present invention relates to semiconductor manufacturing, and, more particularly, to a tape out template system and method.

According to a conventional tape out method, an integrated circuit (IC) designer provides device design data to a design service provider. The design service provider generates mask tooling information according to the device design data. The mask tooling information is then transmitted to a mask house to fabricate masks accordingly.

Data used in a conventional tape out method are typically transmitted and exchanged through verbal information, paper data, fax data, and/or e-mail attachments. Data used for mask tooling are keyed in multiple times, and there is no safety mechanism to protect data integrity during the process.

Additionally, preparation and finalization of mask tooling for fabricating an IC device involves both the customer order of the IC and operators from the manufacturing facility. The customer may provide tape out information to a manufacturing facility using different formats. This introduces additional complexity into the tape out process, as operators from the manufacturing facility may need to manually check the data provided and communicate with the customer addressing aspects of the tape out information that are unclear or incorrect.

Typically, in order to submit a proper tape out request, IC designers need to understand semiconductor manufacturer's specific design rule manual (DRM), masking layer & bias manual (MB), and GDS (Graphic Distribution Stream) layer usage description provided by a semiconductor manufacturer to learn how to best engage their design to a semiconductor manufacturer process. Additionally, the IC designer also needs to learn a tape out form instruction for preparation of a proper tape out request.

Hence, there is a need for a tape out template system that addresses problems arising from the existing technology.

SUMMARY

A tape out template system is provided, creating tape out template and processing a tape out request. The tape out template system comprises a template database, a query database, and a processor. The template database stores a plurality of templates for mask tooling for different manufacturing technologies. Each of the templates comprises a set of mask tooling settings for different manufacturing processes of one of the manufacturing technologies. The query database stores a hierarchy of queries addressing differences among mask tooling information of the manufacturing processes. The processor receives technology information specifying the manufacturing technology of the tape out request, selects one of the templates according to the received technology information, selects and presents at least one of the queries according to the selected template, and determines values of the mask tooling settings according to the answers thereto.

Also disclosed are methods for creating tape out templates and processing a tape out request. A plurality of templates for mask tooling for different manufacturing technologies are provided. Each of the templates comprises a set of mask tooling settings for different manufacturing processes of one of the manufacturing technologies. A hierarchy of queries is provided, addressing differences among mask tooling information of the manufacturing processes. The technology information is then received, wherein the technology information specifies the manufacturing technology of the tape out request. One of the templates is selected according to the provided technology information. At least one of the queries is selected according to the selected template. Values of the mask tooling settings are then determined according to the answers to the presented queries. In other words, the specific manufacturing process is selected according to the answers of the presented queries.

The above-mentioned method may take the form of program code embodied in a computer readable tangible media. When the program code is loaded into and executed by a machine, the machine becomes an apparatus for practicing the invention.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 3A~3E illustrate displays of an embodiment of tape out templates created in the invention.

DETAILED DESCRIPTION

Exemplary embodiments of the invention will now be described with reference to FIGS. 1 through 3, which generally relate to a system for creating tape out templates and processing a tape out request.

In the following detailed description, reference is made to the accompanying drawings which form a part hereof, and in which is shown by way of illustration of specific embodiments. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense. The leading digit(s) of reference numbers appearing in the Figures corresponds to the Figure number, with the exception that the same reference number is used throughout to refer to an identical component which appears in multiple Figures.

Figure 1:
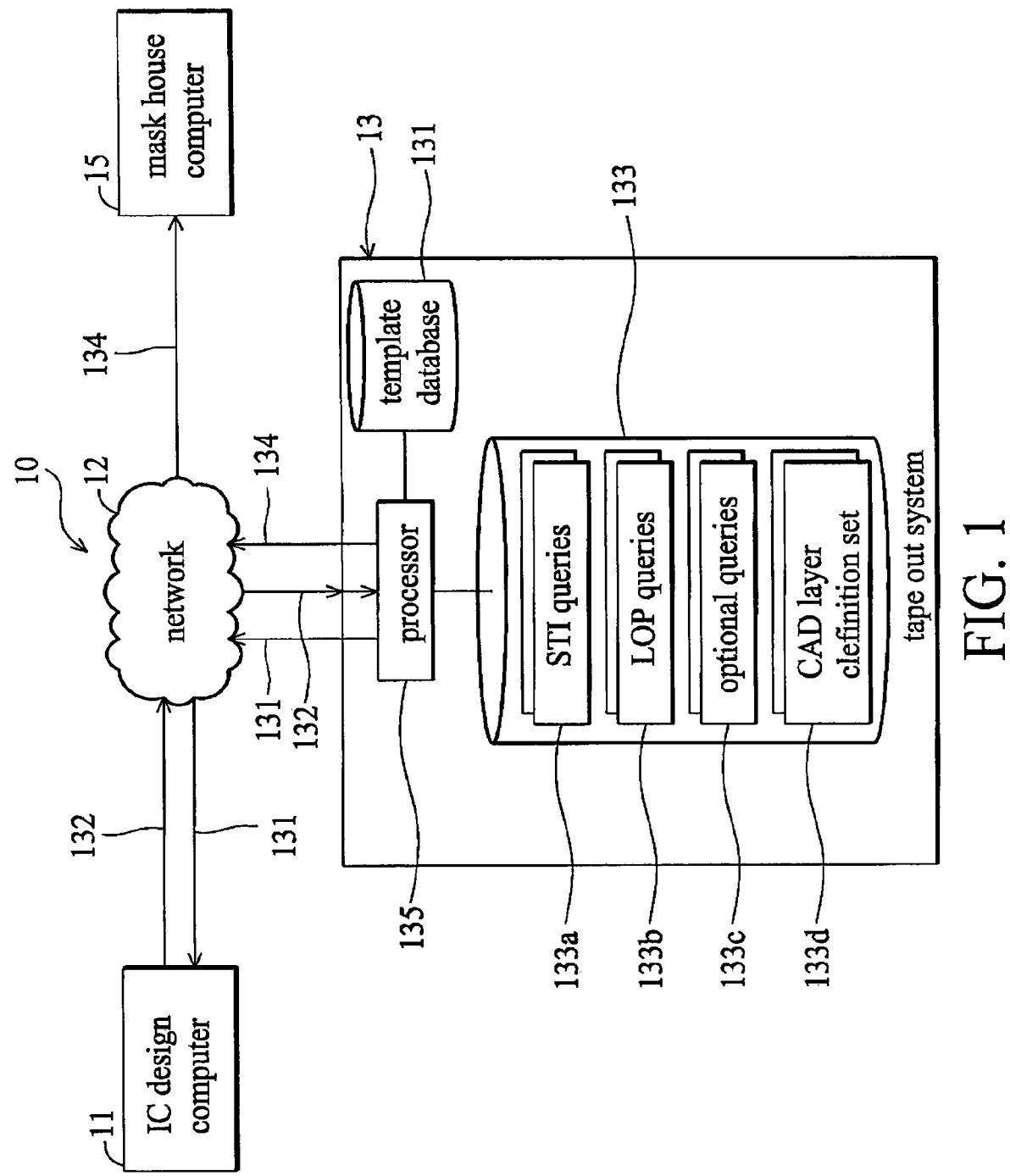
FIG. 1 is a schematic view of an embodiment of a tape out template system according to the invention.
Figure 2:
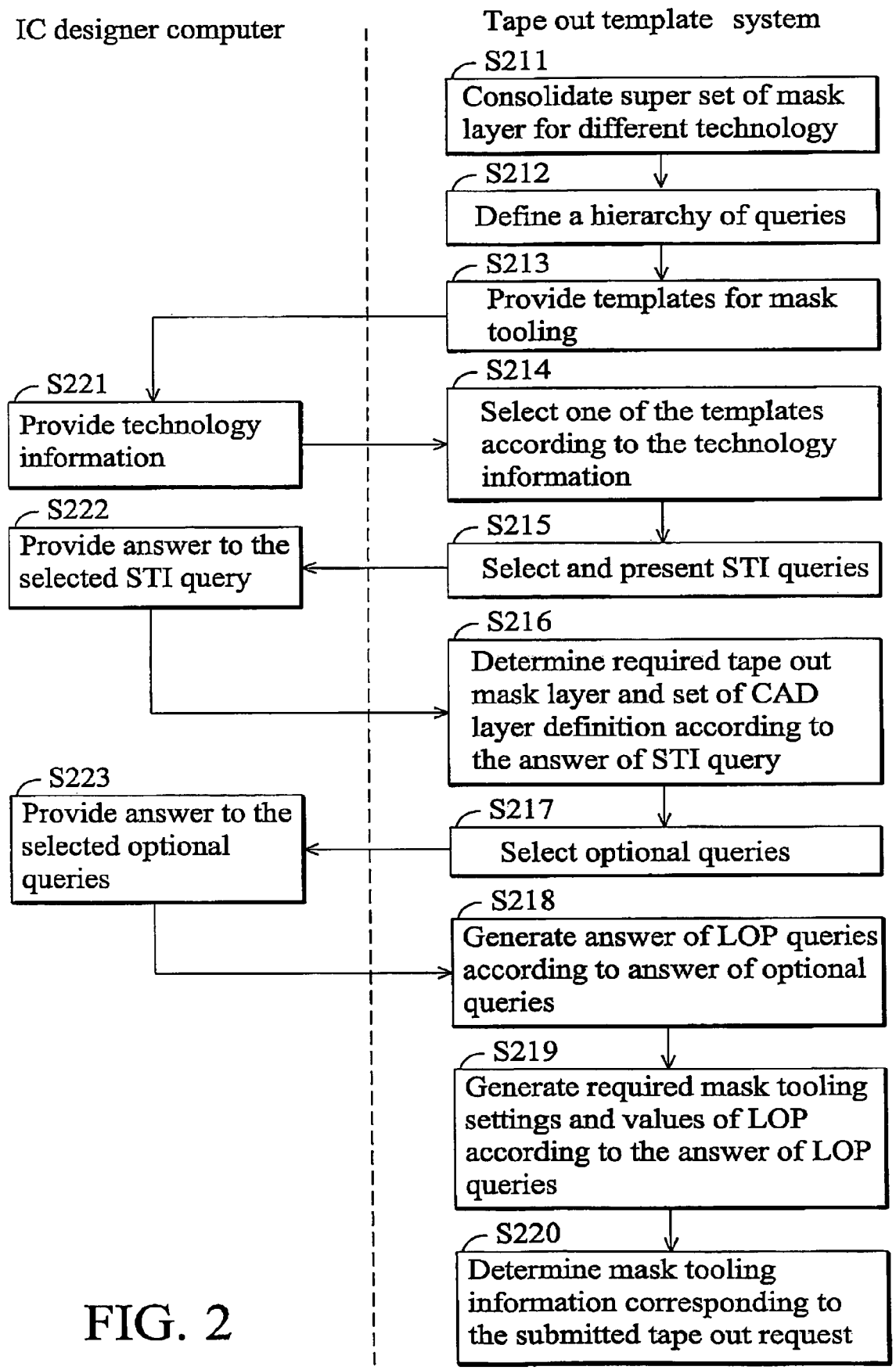
FIG. 2 is a flowchart of an embodiment of a method for creating tape out templates and providing mask tooling data to fulfill a tape out request of the invention.

FIG. 1 is a schematic view of a mask tooling network employing a tape out template system according to the invention. A mask tooling network 10 comprises an integrated circuit (IC) design computer system 11, a tape out template system 13, and a mask house computer 15. The IC design computer system 11, tape out template system 13, and mask house computer 15 communicate with each other via a network 12. The tape out template system 13 provides a mask tooling form 131 to the IC design computer system 11 for receiving device design data, receives a filled mask tooling form 132, and generates mask tooling information 134 according to the device design data. The mask tooling information 134 is then transferred to the mask house computer 15. The mask house fabricates masks according to the mask tooling information. The masks are then used in the fabrication of device corresponding to the device design data.

The tape out template system 13 may be provided by an entity providing a tape out service that converts device design data to mask tooling information. The tape out template system 13 comprises a template database 131, a query database 133, and a processor 135. The template database 131 stores a plurality of templates for mask tooling for different manufacturing technologies. Each of the templates comprises a set of mask tooling settings for different manufacturing processes of one of the manufacturing technologies. The query database 133 stores a hierarchy of queries addressing differences among mask tooling information of the manufacturing processes.

When an IC designer accesses the tape out service, a tape out request for an IC device is submitted. First, technology information corresponding to the IC device is provided. The processor 135 receives technology information specifying the manufacturing technology of the tape out request. The processor 135 selects one of the templates according to the received technology information. The processor 135 then selects at least one of the queries according to the selected template, and directs an interface to present the selected query and receive an answer thereto. The processor 135 then determines values of the mask tooling settings according to answers provided.

According to this embodiment, the hierarchy of queries stored in the query database 133 comprises a set of STI (special technology information) queries 133*a*, a set of LOP (logic operation) queries 133*b*, a set of CAD layer definition 133*d* and a set of optional queries 133*c*. The STI queries 133*a* addresses the differences among a number of mask layers and CAD layers for the manufacturing processes. LOP queries 133*b* addresses the differences among logic operations for the manufacturing processes. The CAD layer definition 133*d* addresses the special circuit CAD layer naming and value in the mask tooling process. The optional queries 133*c* addresses the differences among mask tooling information, other than those specified by the STI and LOP queries, for the manufacturing processes.

Here, the processor 135 selects one of the STI queries according to the selected template, selects one of the optional queries, selecting one of the LOP queries according to the received answer to the optional query.

The tape out template system 13 also provides a template for a specific IC designer. In order to accomplish this, the processor 135 defines different groups of CAD layer definition for a particular user submitting the tape out request. The processor 135 further generates a template form according to the CAD layer definition grouping.

Additionally, when one of the manufacturing processes changes, and/or a new manufacturing process of the manufacturing technology is developed, the mask tooling information corresponding thereto is changed accordingly. After the mask tooling information of the changed/added manufacturing process is generated, the difference between the mask tooling information of the changed/newly added manufacturing process and the existing manufacturing processes is determined. In order to distinguish the changed/newly added manufacturing process from the other manufacturing processes, new STI, LOP, and optional queries are defined accordingly.

The invention also provides a method for creating tape out templates and processing a tape out request. FIG. 2 is a flowchart of a method for creating tape out templates and processing a tape out request.

In step S211, a super set of mask layer in technology is identified (FIG. 3D). Each non-mandatory mask layer in the super set is categorized as a STI query (FIG. 3C). Non-mandatory and non-standard CAD layers (FIG. 3B) are treated the same as a non-mandatory mask layer and covered in STI query.

In step S212, a hierarchy of queries is retrieved from query database 133. Each of the queries addresses differences among mask tooling information of the manufacturing processes. According to an embodiment, the hierarchy of queries comprises four types: STI (special technology information) queries, LOP (logic operation) queries, a set of CAD layer definition, and optional queries. The STI queries address the differences among number of mask layers and CAD layer definition for the manufacturing processes. The LOP queries address the differences among logic operations for the manufacturing processes. The optional queries address the differences among mask tooling information, other than those specified by the STI and LOP queries, for the manufacturing processes.

For the differences on LOP (Logical Operation) of mask layer in FIG. 3D, they are correlated with the LOP query in FIG. 3A and FIG. 3E. The differences on masking tooling information, other than those specified by the STI and LOP queries, are correlated with optional query in FIG. 3A and FIG. 3E as well.

In step S213, a plurality of templates are provided. Each template is used for mask tooling for different manufacturing technologies, and comprises a set of mask tooling settings for different manufacturing processes of one of the manufacturing technologies used in fabrication of an IC device.

Steps S211, S212 and S213 are typically performed by a tape out template system, which can be provided by a semiconductor manufacturer or other entity.

Technology information is then provided, specifying the manufacturing technology of the tape out request (step S221). The technology information is typically provided by an IC designer submitting the tape out request.

One template is selected according to the technology information provided by the IC designer (step S214). As described, each template comprises a set of mask tooling settings for different manufacturing processes of one specific manufacturing technology used for fabricating an IC device. The described STI, LOP, and optional queries determine required mask tooling settings specified in the selected template and values of the required mask tooling settings.

After the template is determined, corresponding template data is retrieved from the template database, and the query relationship is retrieved from query database, at least one STI query is selected and presented to the IC designer (step S215). In step S222, an answer to the selected STI query is provided and transmitted to the tape out template system. In step S216, the number of tape out mask layer and set of CAD layer definition are determined according to the answer to the selected STI query.

In step S217, one optional query is selected. The selected optional query is then presented to the IC designer. In step S223, an answer to the selected optional query is provided and transmitted to the tape out template system.

The STI and optional queries and the answers thereto can narrow the number of candidate mask tooling settings within the selected template effectively. The STI queries and the answers thereto can be processed before the optional queries and the answers thereto. Additionally, the optional queries and the answers thereto can also be processed before the STI queries and the answers thereto. The order of implementing the STI and LOP queries can be customized to meet special needs.

In step S217, one of the LOP queries is selected. In step S218, the answer of the selected LOP query is generated according to the answer to the selected optional query.

In step S219, required mask tooling settings and values thereof are determined. In step S220, mask tooling information corresponding to the submitted tape out request is determined. The determined mask tooling information is then presented to the IC designer. IC designer can make further validation and modification. The finalized mask tooling information is transmitted to a mask house for fabrication of masks corresponding to the tape out request.

The tape out request submitted by a particular IC designer and the mask tooling information converted therefrom are stored as a historical record. The historical record can be categorized according to the CAD layer definitions comprised therein. For example, different groups of CAD layer definitions are defined by the tape out template system, and a customized template can be generated accordingly. The customized template comprises mask tooling settings specified for a particular IC designer.

When an existing manufacturing process is changed, and/or a new manufacturing process is developed, the difference among mask tooling information for the existing and new/changed manufacturing processes is determined. At least one new STI query is defined addressing the difference in the number of mask layers for the existing and new/changed manufacturing processes. At least one LOP query is defined addressing the difference among logic operations for the existing and new/changed manufacturing processes. At least one optional query is defined addressing the difference on mask tooling information, other than those specified by the STI and LOP queries, for the existing and new/changed manufacturing processes.

The method for creating tape out templates and processing a tape out request implemented in the system of the present invention, or certain aspects or portions thereof, may take the form of program code (i.e. instructions) embodied in a tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

While the invention has been described by way of example and in terms of the preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for processing a tape out request, comprising:
a template database storing a plurality of templates for mask tooling for different manufacturing technologies, each template comprising a set of mask tooling settings for different manufacturing processes of one of the manufacturing technologies;
a query database storing a hierarchy of queries addressing differences in mask tooling information of the manufacturing processes; and
a processor, receiving technology information specifying the manufacturing technology of the tape out request, selecting one of the templates according to the received technology information, selecting and presenting at least one of the queries according to the selected template, and determining values of the mask tooling settings according to answers to the at least one of the queries.

2. The system of claim 1, wherein the query database further comprises a set of STI (special technology information) queries addressing the differences among a number of mask layers for the manufacturing processes.

3. The system of claim 2, wherein the query database further comprises a set of LOP (logic operation) queries addressing the differences among logic operations for the manufacturing processes.

4. The system of claim 3, wherein the query database further comprises a set of optional queries addressing the differences in mask tooling information, other than those specified by the STI and LOP queries, for the manufacturing processes.

5. The system of claim 4, wherein the processor further selects one STI query according to the technology information, and selects one LOP query value according to an answer to the at least one of the optional queries.

6. The system of claim 5, further comprising an interface, presenting the selected STI, LOP, and optional queries, and receiving answers to the STI, LOP, and optional queries.

7. The system of claim 4, wherein the processor further selects the LOP query according to the technology information, selects the STI query according to the technology information, and selects one LOP value according to the answer to the selected optional query.

8. The system of claim 7, further comprises an interface, presenting the selected STI, LOP, and optional queries, and receiving answers to the STI, LOP, and optional queries, respectively.

9. The system of claim 1, wherein the processor further defines different groups of CAD layer definition for a particular user submitting the tape out request.

10. The system of claim 9, wherein the processor further generates a template according to the CAD layer definition grouping.

11. A method for processing a tape out request, comprising:
generating a plurality of templates for mask tooling for different manufacturing technologies, each of the templates comprising a set of mask tooling settings for different manufacturing processes of one of the manufacturing technologies;
defining a hierarchy of queries addressing differences among mask tooling information of the manufacturing processes;
receiving technology information specifying the manufacturing technology of the tape out request;
selecting one of the templates according to the received technology information;

selecting at least one of the queries according to the selected template; and determining values of the mask tooling settings according to answers to the presented queries.

12. The method of claim 11, further comprising defining a set of STI (special technology information) queries addressing the differences among a number of mask layers for the manufacturing processes.

13. The method of claim 11, further comprising defining a set of LOP (logic operation) queries addressing the differences among logic operations for the manufacturing processes.

14. The method of claim 11, further comprising defining a set of optional queries addressing the differences in mask tooling information, other than those specified by the STI and LOP queries, for the manufacturing processes.

15. The method of claim 14, further comprising selecting one of the STI queries according to the technology information, selecting one of the LOP queries according to an answer to the at least one of the optional queries.

16. The method of claim 15, further comprising presenting the selected STI, LOP, and optional queries, and receiving answers to the STI, LOP, and optional queries, respectively.

17. The method of claim 14, further comprising selecting one of the LOP queries according to the technology information, selecting one of the STI queries according to the technology information, and selecting one of the LOP value according to an answer to the at least one of the optional queries.

18. The method of claim 17, further comprising presenting the selected STI, LOP, and optional queries, and receiving answers to the STI, LOP, and optional queries, respectively.

19. The method of claim 17, further comprising defining different groups of CAD layer definition for a particular user submitting the tape out request.

20. The method of claim 19, further comprising generating a template according to the CAD layer definition grouping.

* * * * *